(12) United States Patent
Zhang et al.

(10) Patent No.: US 12,707,962 B2
(45) Date of Patent: Aug. 11, 2026

(54) AIR BRIDGE STRUCTURE AND MANUFACTURING METHOD THEREOF, AND SUPERCONDUCTING QUANTUM CHIP AND MANUFACTURING METHOD THEREOF

(71) Applicants: TENCENT TECHNOLOGY (SHENZHEN) COMPANY LIMITED, Shenzhen (CN); SUZHOU INSTITUTE OF NANO-TECH & NANO-BIONICS (SINANO), CHINESE ACADEMY OF SCIENCES, Suzhou (CN)

(72) Inventors: Wenlong Zhang, Shenzhen (CN); Chuhong Yang, Shenzhen (CN); Sainan Huai, Shenzhen (CN); Yarui Zheng, Shenzhen (CN); Shengyu Zhang, Shenzhen (CN); Jiagui Feng, Shenzhen (CN); Kanglin Xiong, Shenzhen (CN); Biao Wu, Shenzhen (CN); Yongdan Huang, Shenzhen (CN); Xiao Chen, Shenzhen (CN); Sunan Ding, Shenzhen (CN)

(73) Assignees: TENCENT TECHNOLOGY (SHENZHEN) COMPANY LIMITED, Shenzhen (CN); SUZHOU INSTITUTE OF NANO-TECH & NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 693 days.

(21) Appl. No.: 17/703,683

(22) Filed: Mar. 24, 2022

(65) Prior Publication Data

US 2022/0216134 A1 Jul. 7, 2022

Related U.S. Application Data

(63) Continuation of application No. PCT/CN2021/123923, filed on Oct. 14, 2021.

(30) Foreign Application Priority Data

Oct. 15, 2020 (CN) ........................ 202011105613.3

(51) Int. Cl.
*H10W 20/40* (2026.01)
*H10W 20/00* (2026.01)
(Continued)

(52) U.S. Cl.
CPC ....... *H10W 20/483* (2026.01); *H10W 20/072* (2026.01); *H10W 20/075* (2026.01); *H10W 20/46* (2026.01); *H10W 70/65* (2026.01)

(58) Field of Classification Search
CPC ........... H01L 21/76837; H01L 23/4821; H01L 23/5221; H10W 20/438; H10W 20/058; H10P 76/2041
See application file for complete search history.

(56) References Cited

U.S. PATENT DOCUMENTS 4,670,297 A 6/1987 Lee et al.
4,814,258 A * 3/1989 Tam ........................ G03F 7/094 430/315

(Continued)

FOREIGN PATENT DOCUMENTS

CN 1466189 A 1/2004
CN 102915957 A 2/2013

(Continued)

OTHER PUBLICATIONS

International Search Report issued Dec. 12, 2021 in Application No. PCT/CN2021/123923, with English Translation, pp. 1-10.

(Continued)

*Primary Examiner* — Jesse Y Miyoshi
(74) *Attorney, Agent, or Firm* — ARENTFOX SCHIFF LLP

(57) ABSTRACT

A manufacturing method for an air bridge structure includes forming a first photoresist structure on a substrate. The first photoresist structure includes a first opening that reveals the substrate. The manufacturing method further includes form- (Continued)

ing a bridge supporting structure on the substrate by depositing an inorganic bridge supporting material on the substrate based on the first opening in the first photoresist structure, and stripping the first photoresist structure after the deposition. Then, the manufacturing method includes forming a second photoresist structure on the substrate. The second photoresist structure includes at least a second opening that reveals at least a portion of the bridge supporting structure on the substrate. Then, the method include forming the air bridge structure by depositing an air bridge material on the substrate based on the second opening and stripping the second photoresist structure after the deposition. Further, the bridge supporting structure can be removed.

19 Claims, 8 Drawing Sheets

(51) Int. Cl.

| | |
|---|---|
| ***H10W 20/46*** | (2026.01) |
| ***H10W 70/65*** | (2026.01) |

(56) References Cited

U.S. PATENT DOCUMENTS

2007/0049031 A1* 3/2007 Kaifu ................ H01L 21/31116 257/E21.252
2012/0094481 A1 4/2012 Kosaka et al.
2016/0322693 A1* 11/2016 Chang .................. H01P 11/003

FOREIGN PATENT DOCUMENTS

EP 0908951 A2 4/1999
JP S6337639 * 2/1988
JP S6337639 A 2/1988
WO 0205347 A2 1/2002

OTHER PUBLICATIONS

Supplementary European Search Report issued Dec. 9, 2022 in Application No. 21838964.1, pp. 1-8.

* cited by examiner

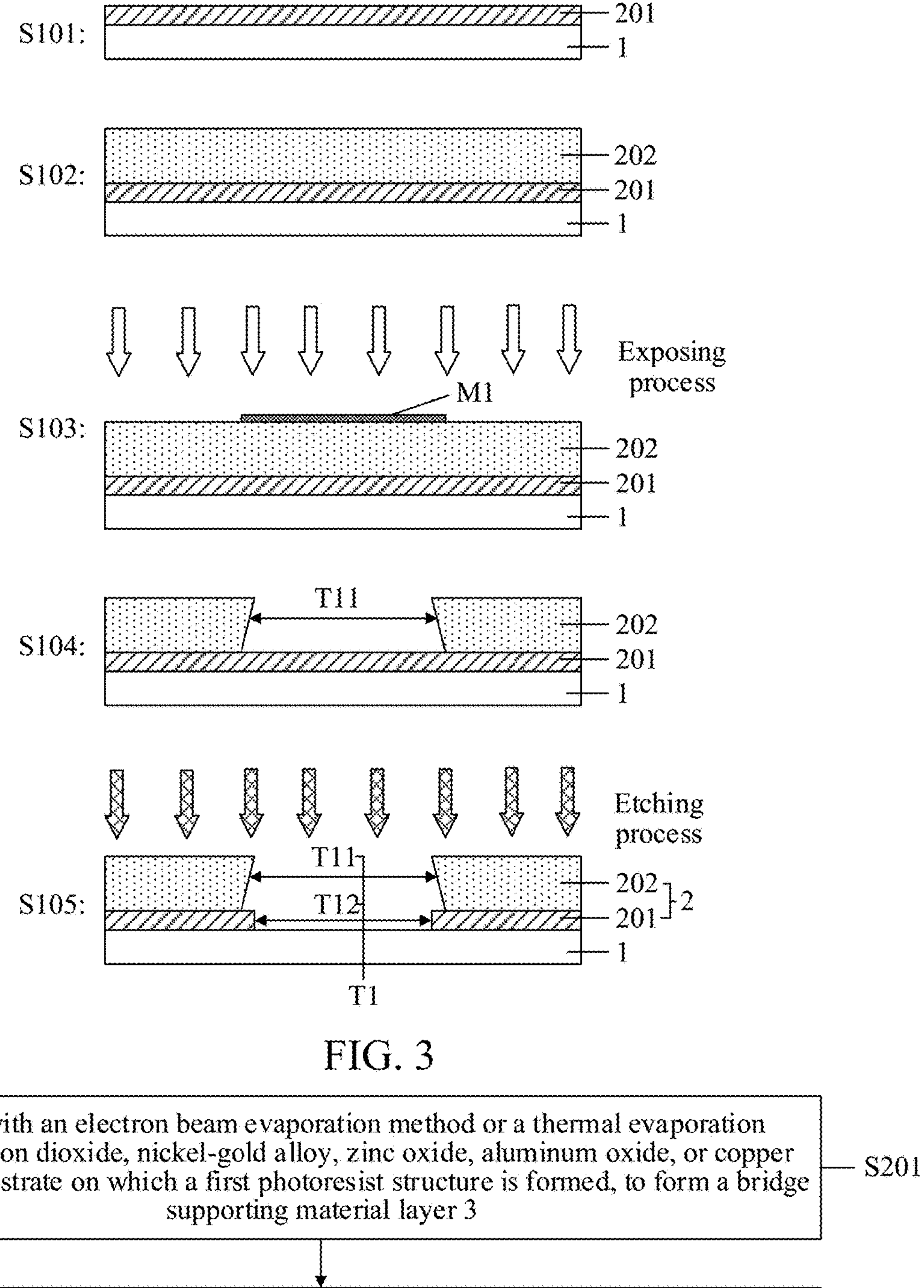

FIG. 3

Deposit, with an electron beam evaporation method or a thermal evaporation method, silicon dioxide, nickel-gold alloy, zinc oxide, aluminum oxide, or copper oxide on a substrate on which a first photoresist structure is formed, to form a bridge supporting material layer 3 — S201

↓

Put the substrate on which the bridge supporting material layer is deposited in a photoresist stripping liquid, and strip the first photoresist structure at a temperature of 20°C to 100°C to obtain the bridge supporting structure located at a first opening — S202

FIG. 4

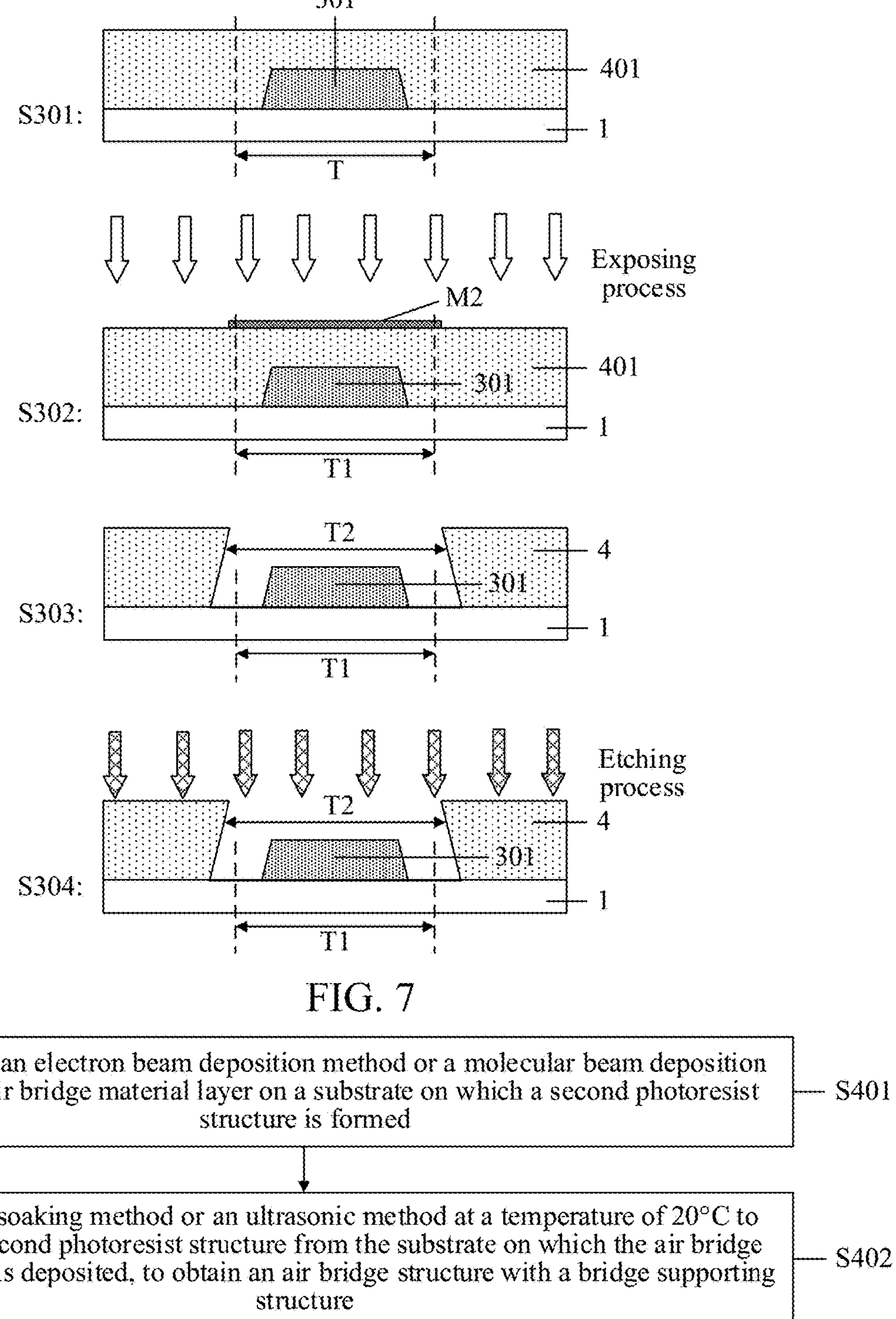

FIG. 7

Deposit, with an electron beam deposition method or a molecular beam deposition method, an air bridge material layer on a substrate on which a second photoresist structure is formed — S401

Strip, with a soaking method or an ultrasonic method at a temperature of 20°C to 100°C, the second photoresist structure from the substrate on which the air bridge material layer is deposited, to obtain an air bridge structure with a bridge supporting structure — S402

Release the bridge supporting structure with a chemical etching method to obtain the air bridge structure, etching gas being able to react with a material of the bridge supporting structure and not react with a material of the air bridge structure — S403

FIG. 8

AIR BRIDGE STRUCTURE AND MANUFACTURING METHOD THEREOF, AND SUPERCONDUCTING QUANTUM CHIP AND MANUFACTURING METHOD THEREOF

RELATED APPLICATIONS

This application is a continuation of International Application No. PCT/CN2021/123923, filed on Oct. 14, 2021, which claims priority to Chinese Patent Application No. 202011105613.3 filed on Oct. 15, 2020. The entire disclosures of the prior applications are hereby incorporated by reference in their entirety.

FIELD OF THE TECHNOLOGY

This disclosure relates to the field of superconducting quantum chip technologies, including an air bridge structure and a manufacturing method thereof, a superconducting quantum chip and a manufacturing method thereof.

BACKGROUND OF THE DISCLOSURE

In order to reduce an unexpected capacitance in a circuit, such as a parasitic capacitance, and to improve the performance of a device, an air bridge structure is often introduced in an electronic device product. The preparation of an air bridge especially a superconducting air bridge in the related art is mainly to prepare, by using the backflow property of a photoresist, the photoresist into an arch shape, then deposit a material in its upper part, then perform secondary coating, exposure, and development, cover the air bridge structure with a protective photoresist, etch away the material at the remaining positions, and finally remove all the photoresist using a photoresist stripping liquid to obtain the air bridge. However, this preparation method can often cause the obtained air bridge structure to fail to meet the expected requirements, resulting in a lower yield of electronic device products.

SUMMARY

Embodiments of this disclosure provide an air bridge structure and a manufacturing method thereof, a superconducting quantum chip and a manufacturing method thereof for the shortcomings of the existing method, which can obtain an air bridge structure with an expected shape and increase the yield of electronic device products.

In some examples, a manufacturing method for an air bridge structure includes forming a first photoresist structure on a substrate. The first photoresist structure includes a first opening that reveals the substrate. The manufacturing method further includes forming a bridge supporting structure on the substrate by depositing an inorganic bridge supporting material on the substrate based on the first opening in the first photoresist structure, and stripping the first photoresist structure after the deposition. Then, the manufacturing method includes forming a second photoresist structure on the substrate. The second photoresist structure includes at least a second opening that reveals at least a portion of the bridge supporting structure on the substrate. Then, the method include forming the air bridge structure by depositing an air bridge material on the substrate based on the second opening and stripping the second photoresist structure after the deposition. Further, the bridge supporting structure can be removed.

Some aspects of the disclosure provide an electronic device. The electronic device includes a substrate; and an air bridge structure formed on the substrate. The air bridge structure includes a bridge pier part that is in contact with the substrate, a bridge top part that is parallel to the substrate without touching the substrate, and a bridge approach part that is connected between the bridge pier part and the bridge top part.

In some examples, the air bridge structure is a vacuum bridge structure. In some examples, the air bridge structure is a first air bridge structure and the electronic device includes a second air bridge structure that is separate from the first air bridge structure. In some examples, the air bridge structure includes a first sub bridge structure having a first sub bridge pier part, a first sub bridge top part and a first sub bridge approach part; and a second sub bridge structure connected with the first sub bridge structure. The second sub bridge structure includes a second sub bridge pier part, a second sub bridge top part and a second sub bridge approach part. Then, the air bridge structure includes an opening between the first sub bridge pier part and the second sub bridge pier part. In some examples, the air bridge structure includes a first sub bridge structure having a first sub bridge pier part, a first sub bridge top part and a first sub bridge approach part and a second sub bridge structure connected with the first sub bridge structure. The second sub bridge structure includes a second sub bridge pier part, a second sub bridge top part and a second sub bridge approach part. Then, the air bridge structure includes an opening between the first sub bridge approach part and the second sub bridge pier part.

The embodiments of this disclosure further provide a superconducting quantum chip, including the foregoing air bridge structure.

Compared with the related art, the embodiments of this disclosure can include the following beneficial effects:

In the air bridge structure and the manufacturing method thereof, and the superconducting quantum chip and the manufacturing method thereof provided by the embodiments, an inorganic material is used to form the bridge supporting structure, and the shape of the bridge supporting structure can be adjusted by adjusting the first photoresist structure, so as to obtain an air bridge structure with an expected shape; and the temperature of the process of forming the bridge supporting structure will not be too high, which can avoid the problem of change of the photoresist property and difficult removal of the photoresist caused by high temperature, and can also avoid the impact of high temperature on the property of a temperature-sensitive device. Meanwhile, the air bridge structure is obtained by stripping the second photoresist structure without etching the air bridge material layer, to avoid a case that the air bridge structure is etched and damaged to cause poor connection between the air bridge structure and the circuit on the substrate, thereby effectively improving the performance of a product with the air bridge structure and further increasing the yield of electronic device products.

BRIEF DESCRIPTION OF THE DRAWINGS

FIG. 3 is an exemplary schematic process diagram corresponding to a process of step S1 in the manufacturing method for an air bridge structure shown in FIG. 2.

FIG. 4 is an exemplary schematic flowchart of step S2 in the manufacturing method for an air bridge structure shown in FIG. 1.

FIG. 7 is an exemplary schematic process diagram corresponding to a process of step S3 in the manufacturing method for an air bridge structure shown in FIG. 6.

FIG. 8 is an exemplary schematic flowchart of step S4 in the manufacturing method for an air bridge structure shown in FIG. 1.

REFERENCE NUMERALS

Figure 1:
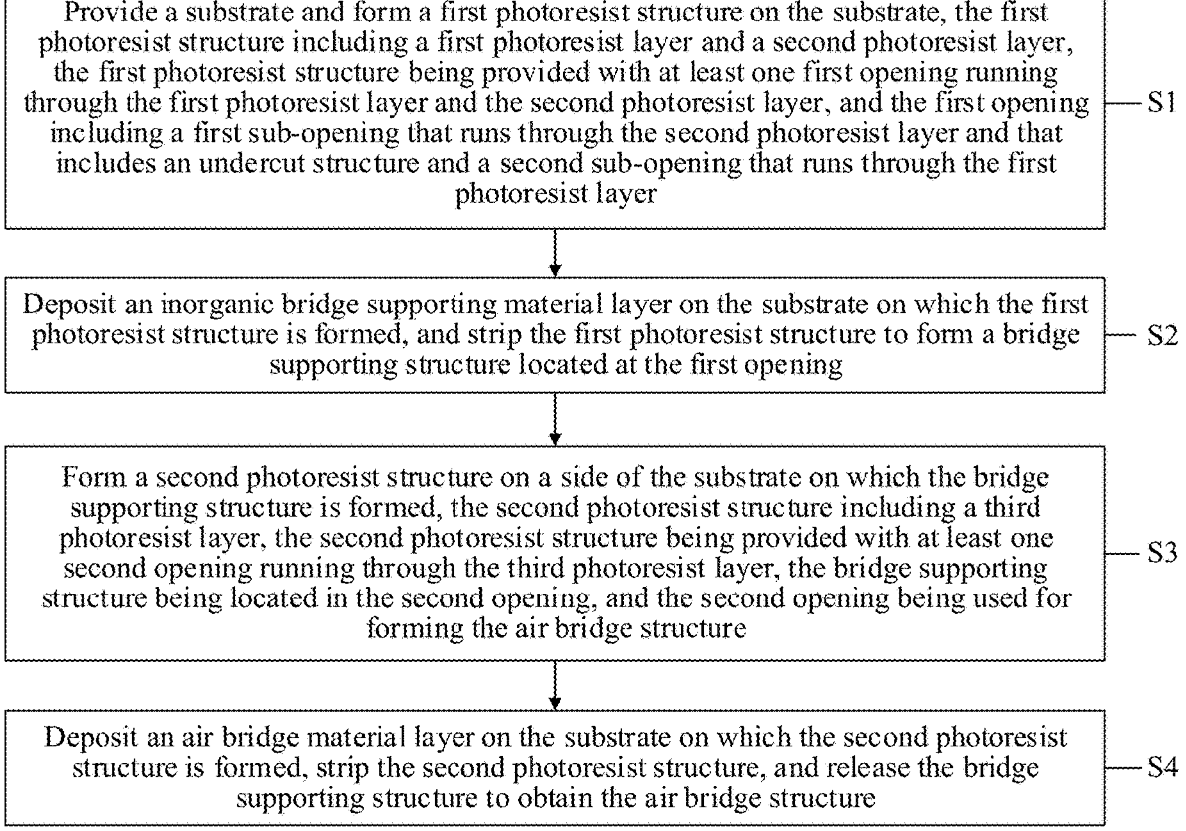
FIG. 1 is a schematic flowchart of a manufacturing method for an air bridge structure according to an embodiment of this disclosure.

- 1—Substrate;
- 2—First photoresist structure; 201—First photoresist layer; 202—Second photoresist layer; T1—First opening; T11—First sub-opening; T12—Second sub-opening;
- 3—Bridge supporting material layer; 301—Bridge supporting structure; 302—To-be-stripped bridge supporting material part;
- 4—Second photoresist structure; 401—Third photoresist layer; T2—Second opening;
- 5—Air bridge material layer; 501—Air bridge structure; 5011—Bridge top part; 5012—Bridge pier part; 5013—Bridge approach part; 502—To-be-stripped air bridge material part.

DESCRIPTION OF EMBODIMENTS

This disclosure is described in detail below, and examples of the embodiments of this disclosure are shown in accompanying drawings, where the same or similar elements or the elements having same or similar functions are denoted by the same or similar reference numerals throughout the description. In addition, if a detailed description of the known art is unnecessary for the features of this disclosure shown, it will be omitted. The embodiments described below with reference to the accompanying drawings are exemplary and used only for explaining this disclosure, and are not to be construed as a limitation on this disclosure.

In the following descriptions, the term "some embodiments" describes subsets of all possible embodiments, but it may be understood that "some embodiments" may be the same subset or different subsets of all the possible embodiments, and can be combined with each other without conflict.

A person skilled in the art may understand that, the singular forms "a", "an", "said", and "the" used herein may include the plural forms as well, unless the context clearly indicates otherwise. It is to be further understood that, the terms "include" and/or "comprise" used in this specification of this disclosure refer to the presence of stated features, integers, steps, operations, elements, and/or components, but do not preclude the presence or addition of one or more other features, integers, steps, operations, elements, components, and/or combinations thereof.

Unless otherwise defined, meanings of all technical and scientific terms used in this specification are the same as those usually understood by a person skilled in the art to which this disclosure belongs. Terms used in this specification are merely intended to describe objectives of the embodiments of this disclosure, but are not intended to limit this disclosure.

Before the embodiments of this disclosure is further described in detail, a description is made on terms involved in the embodiments of this disclosure, and the following explanations are applicable to the terms involved in the embodiments of this disclosure.

Separable air bridge structure: means that adjacent air bridge structures are not connected to each other; and are independent air bridges.

Fully-wrapped air bridge structure: means that at least two air bridge structures are connected to form an entire air bridge.

Undercut structure: is a photoresist structure, which means that the bottom of the photoresist is wider than the top, the sidewalls expand gradually outward from top to bottom, and the cross section of the photoresist is a regular trapezoid, a "a" shape, or the like.

Primer: because of the substrate heating, a chemical reaction during the development process, an oxidation in the air and other factors, the photoresist at the interface of the substrate surface coated with the photoresist degenerates, and no longer dissolves in the common developing solution, which is a type of "residual photoresist". In the field of micro and nano processing, a chemical or physical etching method such as a photoresist stripping machine is usually used to remove the primer.

In the related art, the backflow property of a photoresist is usually used to prepare the air bridge structure, but it is difficult to adjust the shape of the obtained air bridge structure. In addition, the backflow temperature (80° C.-300° C.) of the photoresist is relatively high, which has a large impact on some temperature-sensitive devices, and can easily cause the property of the photoresist to change and make it difficult to remove the photoresist as well as affect the property of temperature-sensitive devices in products. For example, a superconducting tunnel junction used as a bit in a superconducting quantum chip will have dramatic property changes when the temperature exceeds 150° C.; The photoresist after high temperature backflow is prone to carbonization and to have other property changes, and it is difficult to completely remove the generated components in the subsequent releasing process. In addition, the air bridge material layer needs to be etched, and the etching process is prone to carve directly through the circuit structure at the bottom, making a break between the bridge pier part of the air bridge and the circuit. These problems can often cause the obtained air bridge structures to fail to meet the expected requirements, resulting in a lower yield of electronic device products.

Based on this, the embodiments of this disclosure provide an air bridge structure and a manufacturing method thereof, and a superconducting quantum chip and a manufacturing method thereof.

The following is a detailed description of the technical solution of this disclosure and how the technical solution of this disclosure solves the above technical problems in some embodiments.

The embodiments of this disclosure provide a manufacturing method for an air bridge structure, and as shown in FIG. 1, the manufacturing method for an air bridge structure provided by the embodiments includes:

At S1: a substrate is provided and a first photoresist structure is formed on the substrate. The first photoresist structure includes a first photoresist layer and a second photoresist layer. The first photoresist structure is provided with at least one first opening running through the first photoresist layer and the second photoresist layer, and the first opening includes a first sub-opening that runs through the second photoresist layer and that includes an undercut structure and a second sub-opening that runs through the first photoresist layer.

At S2: An inorganic bridge supporting material layer is deposited on the substrate on which the first photoresist structure is formed, and the first photoresist structure is stripped to form a bridge supporting structure located at the first opening.

In some embodiments, after the first photoresist structure is stripped, the bridge supporting material on the first photoresist structure is also stripped simultaneously.

At S3: A second photoresist structure is formed on a side of the substrate on which the bridge supporting structure is formed. The second photoresist structure includes a third photoresist layer, the second photoresist structure is provided with at least one second opening running through the third photoresist layer, the bridge supporting structure is located in the second opening, and the second opening is used for forming the air bridge structure.

At S4: An air bridge material layer is deposited on the substrate on which the second photoresist structure is formed; the second photoresist structure is stripped, and the bridge supporting structure is released to obtain the air bridge structure.

In some embodiments, the releasing the bridge supporting structure means removing the bridge supporting structure. For example, gas that can react with the material of the bridge supporting structure is introduced with a chemical etching method to deplete the material of the bridge supporting structure, thereby releasing the bridge supporting structure.

According to the foregoing manufacturing method for an air bridge structure, an inorganic material is used to form the bridge supporting structure, and the shape of the bridge supporting structure can be adjusted by adjusting the first photoresist structure, so as to obtain an air bridge structure with an expected shape; and the temperature of the process of forming the bridge supporting structure will not be too high, which can avoid the problem of change of the photoresist property and difficult removal of the photoresist caused by high temperature, and can also avoid the impact of high temperature on the property of a temperature-sensitive device. Meanwhile, the air bridge structure is obtained by stripping the second photoresist structure without etching the air bridge material layer, to avoid a case that the air bridge structure is etched and damaged to cause poor connection between the air bridge structure and the circuit on the substrate, thereby effectively improving the performance of a product with the air bridge structure.

Figure 2:
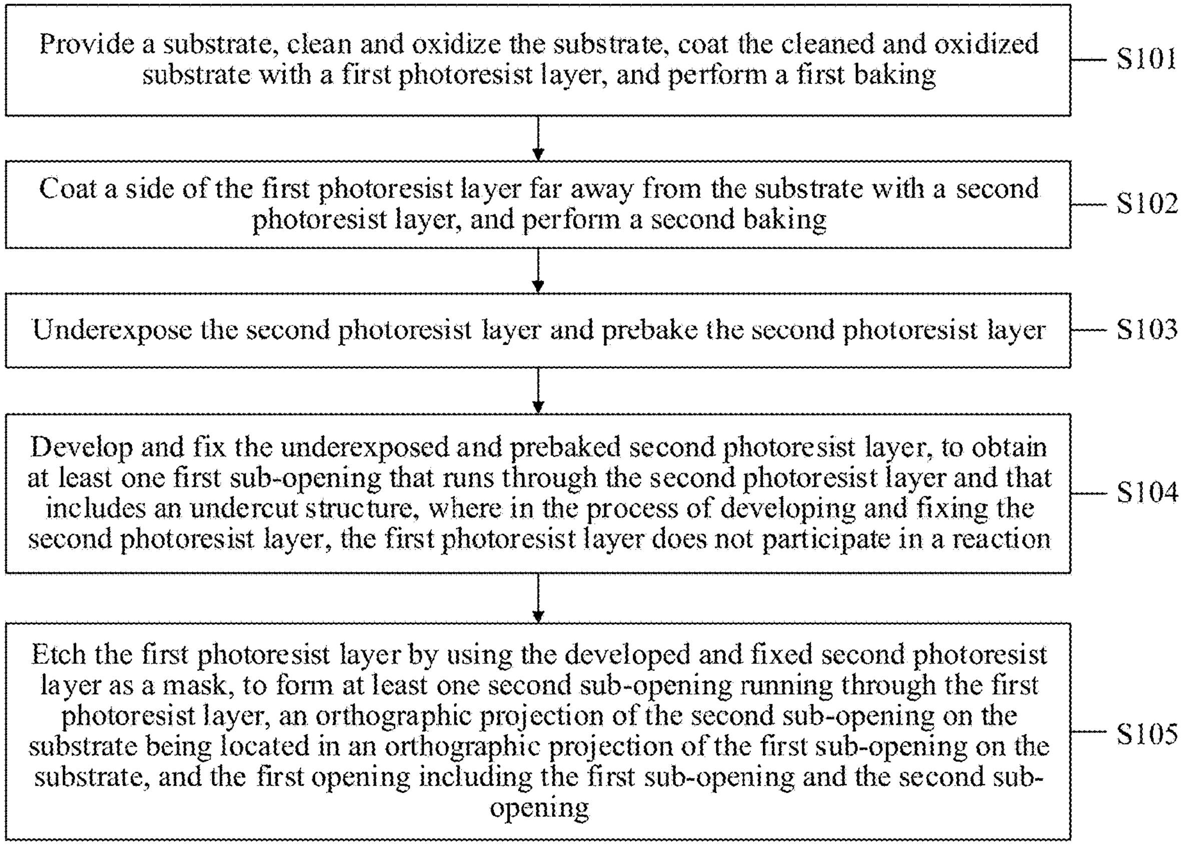
FIG. 2 is an exemplary schematic flowchart of step S1 in the manufacturing method for an air bridge structure shown in FIG. 1.

In some embodiments, as shown in FIG. 2 and FIG. 3, in the manufacturing method for an air bridge structure provided by the embodiments, step S1 may include:

At S101: The substrate 1 is provided. The substrate 1 can be cleaned and oxidized. The cleaned and oxidized substrate 1 is coated with the first photoresist layer 201, and a first baking is performed.

In some embodiments, the surface of the substrate 1 is oxidized in a pure oxygen environment or an oxygen and argon environment to form an oxidized layer with a specific thickness on the surface of the substrate 1.

In actual implementations, the first photoresist layer 201 being used as a primer, step S101 may include: coat the cleaned and oxidized substrate 1 with the first photoresist layer 201 with a thickness of $h_1$, and perform the first baking at a soft baking temperature of the first photoresist layer 201, where $5h_1 \leq H_1 \leq 6h_1$, and $H_1$ is a height of the bridge supporting structure 301.

At S102: A side of the first photoresist layer 201 far away from the substrate 1 is coated with the second photoresist layer 202, and a second baking is performed.

In some embodiments, the second photoresist layer 202 is used as a patterned structure layer, step S102 may include:

coating the side of the first photoresist layer 201 far away from the substrate 1 with the second photoresist layer 202 with a thickness of $h_2$, and performing the second baking at a soft baking temperature of the second photoresist layer 202, where $h_1+h_2>H_1$.

At S103: The second photoresist layer 202 is underexposed and the second photoresist layer 202 is prebaked.

In some embodiments, step S103 may include: underexposing the second photoresist layer 202 with an ultraviolet exposure process or a laser direct writing process, and prebaking the second photoresist layer 202 at a prebaking temperature of the second photoresist layer 202.

In actual implementations, the second photoresist layer 202 is underexposed by using a first mask M1.

At S104: The underexposed and prebaked second photoresist layer 202 is developed and fixed, to obtain at least one first sub-opening T11 that runs through the second photoresist layer 202 and that includes an undercut structure, where in the process of developing and fixing the second photoresist layer 202, the first photoresist layer 201 does not participate in a reaction.

In some embodiments, step S104 may include: developing for 90 s to 150 s in the TMAH developing solution with a concentration less than 1.5% at a temperature of 20° C. to 25° C., and fixing for at least 40 s in a fixing solution being deionized water.

At S105: The first photoresist layer 201 is etched by using the developed and fixed second photoresist layer 202 as a mask, to form at least one second sub-opening T12 running through the first photoresist layer 201, an orthographic projection of the second sub-opening T12 on the substrate 1 is located in an orthographic projection of the first sub-opening T11 on the substrate 1, and the first opening T1 includes the first sub-opening T11 and the second sub-opening T12.

In some embodiments, step S105 may include: etching the first photoresist layer 201 by using the developed and fixed second photoresist layer 202 as the mask with a physical etching, a chemical etching, or an etching method combining the physical etching and the chemical etching, to form the at least one second sub-opening T12 running through the first photoresist layer 201.

According to the manufacturing method for an air bridge structure 501 provided by the embodiments, the first photoresist layer 201 is used as the primer and the second photoresist layer 202 is used as the patterned structure layer, which is more helpful for adjusting the shape of the first opening T1, thereby adjusting the shape of the air bridge structure 501.

Figures 5, 6:
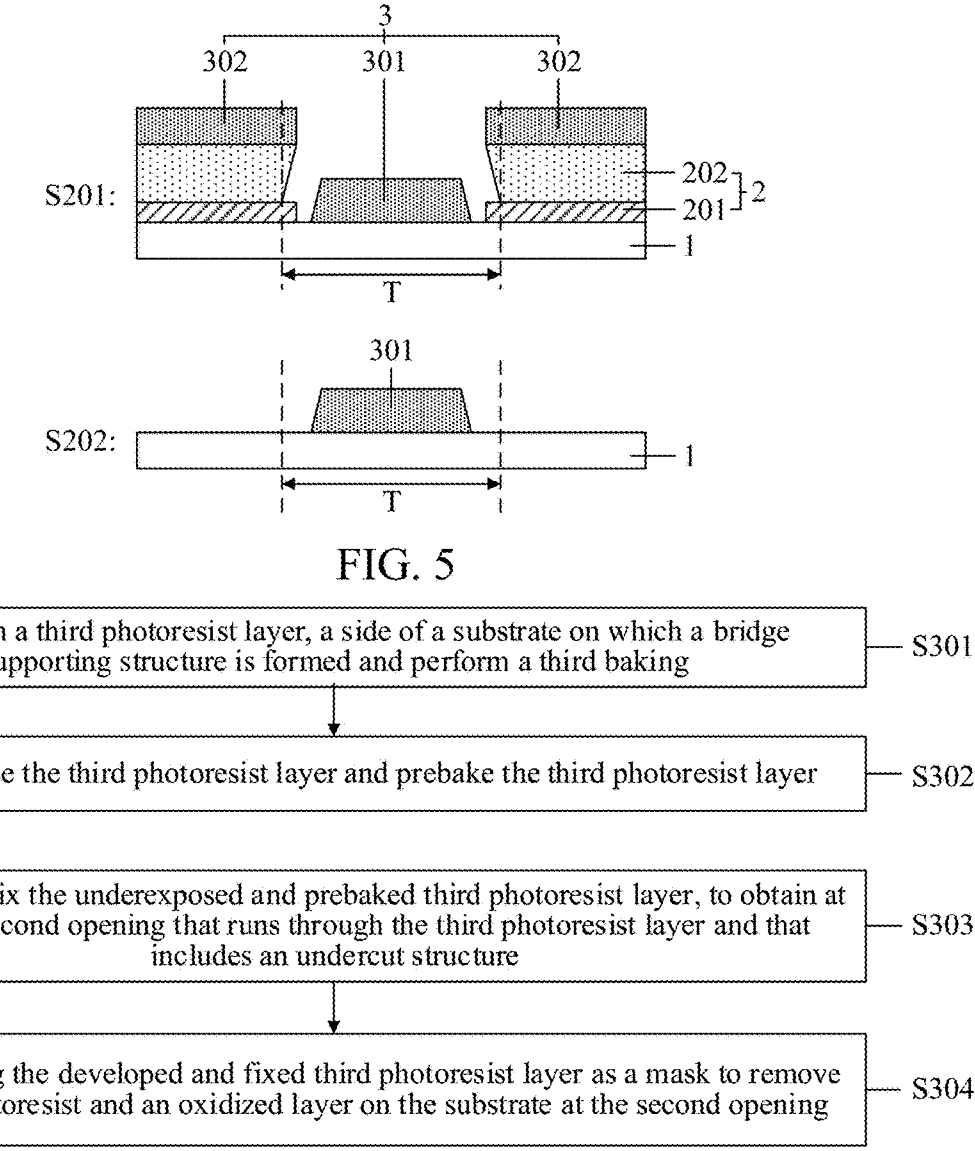
FIG. 5 is an exemplary schematic process diagram corresponding to a process of step S2 in the manufacturing method for an air bridge structure shown in FIG. 4.
FIG. 6 is an exemplary schematic flowchart of step S3 in the manufacturing method for an air bridge structure shown in FIG. 1.

In some embodiments, as shown in FIG. 4 and FIG. 5, according to the foregoing manufacturing method for an air bridge structure, step S2 may include:

At S201: With an electron beam evaporation method or a thermal evaporation method, silicon dioxide, nickel-gold alloy, zinc oxide, aluminum oxide, or copper oxide is deposited on the substrate 1 on which the first photoresist structure 2 is formed, to form an inorganic bridge supporting material layer 3.

The bridge supporting material layer 3 includes: a bridge supporting structure 301 and a to-be-stripped bridge supporting material part 302 that covers the first photoresist structure 2.

In some embodiments, the bridge supporting material may grow under an initial condition being the room temperature, and a qualified bridge supporting material layer 3 may be obtained under the condition that the growth temperature does not exceed 80° C.

At S202: The substrate 1 on which the bridge supporting material layer 3 is deposited is put in a photoresist stripping liquid, and the first photoresist structure 2 is stripped at a temperature of 20° C. to 100° C. to obtain the bridge supporting structure 301 located at the first opening T1.

In actual implementations, after the first photoresist structure 2 is stripped, the to-be-stripped bridge supporting material part 302 on the first photoresist structure 2 is also stripped simultaneously.

According to the foregoing manufacturing method for an air bridge structure, an inorganic material such as silicon dioxide is used as the material of the bridge supporting structure 301, which can easily adjust the shape of the bridge supporting structure 301 by adjusting the first photoresist structure 2 to obtain an air bridge structure with an expected shape, and the temperature to form the bridge supporting structure 301 by using the inorganic material, such as silicon dioxide, is relatively low, which will not cause the problem that the photoresist is difficult to be removed due to high temperature, and not affect the temperature-sensitive devices in the product either.

In some embodiments, as shown in FIG. 6 and FIG. 7, according to the foregoing manufacturing method for an air bridge structure, step S3 may include:

At S301: The third photoresist layer 401 is coated on a side of the substrate 1 on which the bridge supporting structure 301 is formed and perform a third baking.

In some embodiments, step S301 may include: coating, with a third photoresist layer 401 with a thickness of $h_3$, the side of the substrate 1 on which the bridge supporting structure 301 is formed and perform a third baking at a soft baking temperature of the third photoresist layer 401, where $H_1+H_2 \leq 3h_3$, $H_1$ is a height of the bridge supporting structure 301, and $H_2$ is a thickness of the air bridge structure.

At S302: The third photoresist layer 401 is underexposed and the third photoresist layer 401 is prebaked.

In some embodiments, step S302 may include: underexposing the third photoresist layer 401 with an ultraviolet exposure process or a laser direct writing process, and prebaking the third photoresist layer 401 at a prebaking temperature of the third photoresist layer 401.

At S303: The underexposed and prebaked third photoresist layer 401 is developed and fixed, to obtain at least one the second opening T2 that runs through the third photoresist layer 401 and that comprises the undercut structure;

In some embodiments, Step S303 may include: developing for 30 s to 45 s in the TMAH developing solution of 2.38% at a temperature of 20° C. to 25° C., and fixing for at least 40 s in the deionized water at the room temperature.

At S304: By using the developed and fixed third photoresist layer 401 as the mask, residual photoresist and an oxidized layer on the substrate 1 are etched and removed based on the second opening T2.

In some embodiments, step S304 may include: etching, by using the developed and fixed third photoresist layer 401 as the mask with the physical etching, the chemical etching, or the etching method combining the physical etching and the chemical etching, to remove residual photoresist and an oxidized layer on the substrate 1 at the second opening T2. Because the substrate 1 is oxidized in the foregoing steps, the oxidized layer with a certain thickness is formed on a surface of the substrate 1, which is helpful for controlling an etching time of the process of performing etching to remove the oxidized layer in this step, to prevent the existing circuit structure on the substrate 1 from being damaged.

According to the foregoing manufacturing method for the air bridge structure 501, the developed and fixed third photoresist layer 401 is used as the mask to etch the residual photoresist and the oxidized layer on the substrate 1 at the second opening T2, to cause the exposed substrate 1 at the second opening T2 to be in a cleaned and non-oxidation state, which is helpful for improving the connectivity between the subsequently deposited air bridge material and a circuit on the substrate 1.

Figures 9, 10, 11:
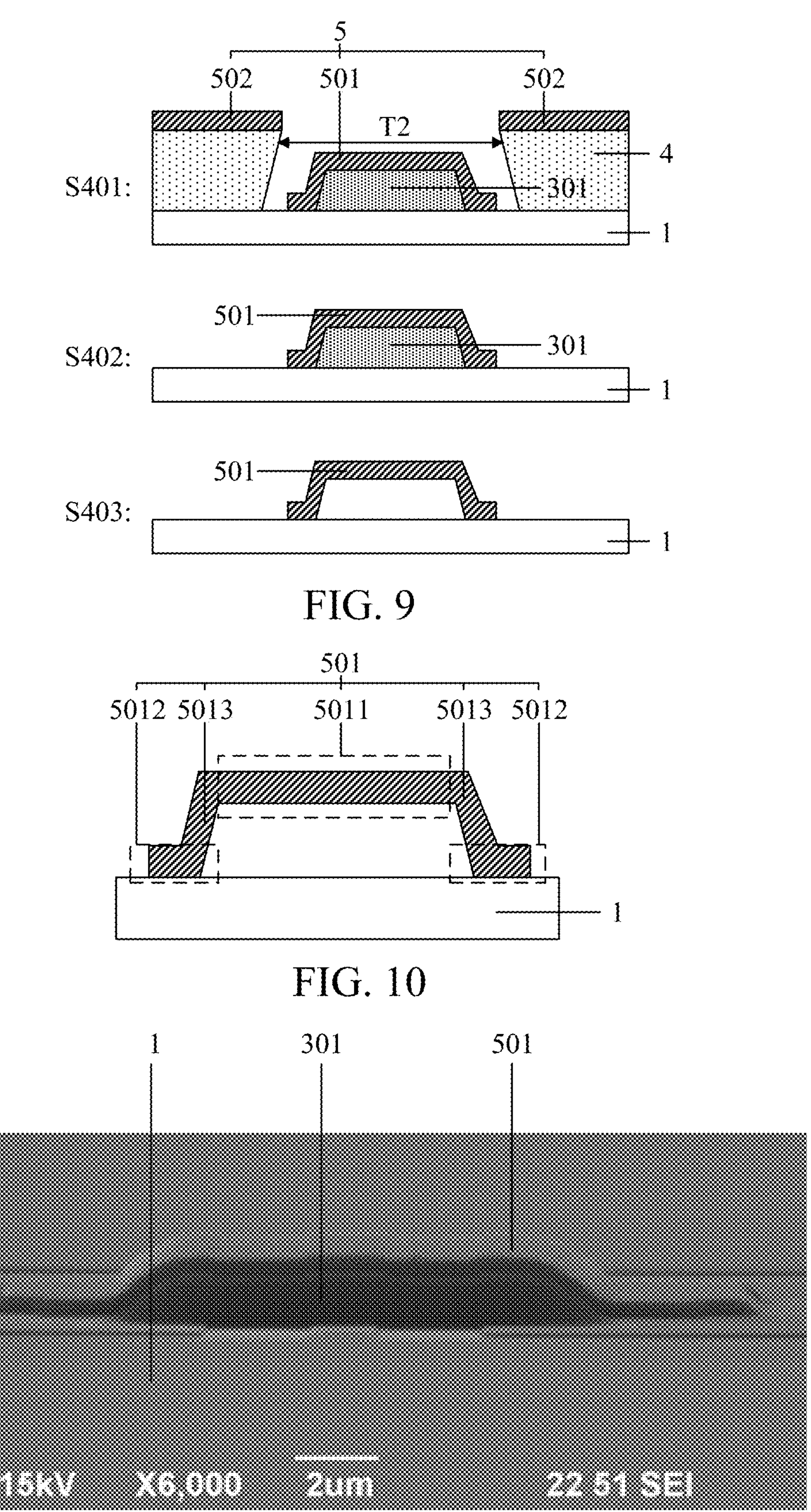
FIG. 9 is an exemplary schematic process diagram corresponding to a process of step S4 in the manufacturing method for an air bridge structure shown in FIG. 8.
FIG. 10 is an exemplary schematic cross-sectional view of an air bridge structure according to an embodiment of this disclosure.
FIG. 11 is a scanning electron micrograph of a separable air bridge structure before releasing the bridge supporting structure according to an embodiment of this disclosure.

In some embodiments, as shown in FIG. 8 and FIG. 9, according to the foregoing manufacturing method for an air bridge structure, step S4 may include:

At S401: With an electron beam deposition method or a molecular beam deposition method, an air bridge material layer 5 is deposited on the substrate 1 on which a second photoresist structure 4 is formed.

In some embodiments, the air bridge material layer 5 may be made of metal such as copper, aluminum, or silver or an alloy thereof. The air bridge material layer 5 includes the air bridge structure 501 and a to-be-stripped air bridge material part 502.

At S402: With a soaking method or an ultrasonic method at a temperature of 20° C. to 100° C., the second photoresist structure 4 is stripped from the substrate 1 on which the air bridge material layer 5 is deposited, to obtain the air bridge structure 501 with the bridge supporting structure 301.

In some embodiments, when the soaking method is adopted to strip the second photoresist structure 4, a soaking solution used does not react with a material of the air bridge structure 501.

At S403: The bridge supporting structure 301 is released (e.g., removed) with a chemical etching method to obtain the air bridge structure 501, etching gas that is able to react with the material of the bridge supporting structure 301 and does not react with the material of the air bridge structure 501 can be used.

In some embodiments, descriptions are made by using an example in which the material of the bridge supporting structure 301 is silicon dioxide and the material of the air bridge structure 501 is an electrically conductive material such as aluminum that does not react with hydrogen fluoride, and S403 includes the following steps: Introducing catalytic gas into an etching machine first, next introducing hydrogen fluoride gas to etch the bridge supporting structure 301, and then introducing nitrogen gas to take away substances generated during reaction of the hydrogen fluoride gas with the material of the bridge supporting structure 301 from the air bridge structure 501. The catalytic gas includes gaseous water, ethanol, methanol, and isopropanol, and the hydrogen fluoride gas is anhydrous hydrogen fluoride gas.

In some embodiments, the reaction formula of silicon dioxide and hydrogen fluoride gas is as follows:

$$SiO_2(s)+4HF(g)=2H_2O(g)+SiF_4(g)$$

where in the reaction formula, (s) indicates that the state of a substance is a solid state, and (g) indicates that the state of a substance is a gaseous state. Because gaseous $H_2O$ and gaseous $SiF_4$ are produced, nitrogen gas is introduced to take away the gaseous $H_2O$ and the gaseous $SiF_4$ from the air bridge structure 501. In addition, aluminum used for forming the air bridge structure 501 does not react, so that the air bridge structure 501 with a complete structure is obtained after the bridge supporting structure 301 is released. Alternatively, the electrically conductive material that does not react with hydrogen fluoride may be a metal material such as copper or silver, or an alloy material such as a copper alloy, an aluminum alloy, or a silver alloy.

The embodiments of this disclosure provide an implementation of the manufacturing method for an air bridge structure 501, and the implementation includes the following steps:

At Step 1: The first photoresist structure 2 is formed on the substrate 1.

The cleaned and oxidized substrate 1 is spin-coated with a PMMA (polymethyl methacrylate, acrylic) photoresist as a first photoresist layer 201, and baking is performed at 180° C. for 100 s to 150 s.

The first photoresist layer 201 is spin-coated with an AZ series reversal photoresist as a second photoresist layer 202, and baking is performed at 95° C. for 60 s to 120 s.

Prebaking is performed at 95° C. with an ultraviolet exposure method, and then exposing is performed for 45 s to 90 s using the mask, the exposure time being less than a full-exposure time of the second photoresist layer 202 with the thickness, that is, underexposing is performed.

The underexposed substrate 1 is put in the TMAH developing solution of 2.38%, developing is performed at a temperature of 20° C. to 25° C. for 30 s to 45 s, the developed substrate 1 is put in the fixing solution being deionized water, and fixing is performed at the room temperature for at least 40 s, to form the first sub-opening T11 on the second photoresist layer 202.

The developed and fixed second photoresist layer 202 is used as the mask, and the first photoresist layer 201 at the first sub-opening T11 is etched by using oxygen plasma for 5 min to 10 min (which is related to the thickness of the first photoresist layer 201), to form the second sub-opening T12 running through the first photoresist layer 201, the first opening T1 including the first sub-opening T11 and the second sub-opening T12, that is, the first photoresist structure 2 provided with the first opening T1 is obtained.

At Step 2: The bridge supporting structure 301 is obtained.

A silicon dioxide film is evaporated at the room temperature with an electron beam evaporation method, the silicon dioxide film covering the first photoresist structure 2 and the substrate 1 at the first opening T1.

The substrate 1 on which the silicon dioxide film is evaporated is put in acetone to strip the second photoresist structure 4 and the silicon dioxide film covering the second photoresist structure 4, to obtain the bridge supporting structure 301 located on the substrate 1.

At Step 3: The second photoresist structure 4 is obtained.

The substrate 1 on which the bridge supporting structure 301 is formed is spin-coated with the AZ series reversal photoresist, and baking is performed at 95° C. for 60 s to 120 s.

Prebaking is performed at 95° C. with an ultraviolet exposure method, and then exposing is performed for 45 s to 90 s using the mask, the exposure time being less than a full-exposure time of the second photoresist layer 202 with the thickness, that is, underexposing is performed. In some embodiments, for a fully-wrapped air bridge, the patterned second photoresist structure 4 has an open hole pattern at a bridge pier part and a bridge approach part.

The second photoresist structure 4 is used as the mask, and the residual photoresist and an oxidized layer on the substrate 1 are removed by using an ion beam etching. In this way, the connectivity between the air bridge structure 501 and a circuit on the substrate 1 can be improved.

At Step 4: The air bridge structure 501 is obtained.

An aluminum film with a certain thickness is deposited as the air bridge material layer 5 with the electron beam evaporation method, the aluminum film covering the second photoresist structure 4, the bridge supporting structure 301, and the substrate 1 in the second opening T2 except the bridge supporting structure 301.

The substrate 1 on which the aluminum film is deposited is put in acetone to strip the second photoresist structure 4 and the aluminum film covering the second photoresist structure 4, to obtain the air bridge structure 501 with the bridge supporting structure 301.

The substrate 1 including the air bridge structure 501 with the bridge supporting structure 301 is put in an HF etching machine, gaseous ethanol is introduced first, anhydrous HF gas is then introduced for a period of time, and nitrogen gas is introduced finally, to fully release the material of the silicon dioxide bridge supporting structure 301 to obtain the air bridge structure 501.

The embodiments of this disclosure provide a manufacturing method for a superconducting quantum chip, the method includes the manufacturing method for an air bridge structure according to the foregoing embodiments and has beneficial effects of the manufacturing method for an air bridge structure according to the foregoing embodiments, and details are not described again herein.

In some embodiments, the manufacturing method for a superconducting quantum chip provided by this embodiment further includes the steps of forming a capacitor, forming a connection line, forming a pad, and the step of packaging, and the like, which will not be described in detail in this embodiment.

The embodiments of this disclosure further provide an air bridge structure 501, and as shown in FIG. 10, the air bridge structure 501 is manufactured by using the manufacturing method for an air bridge structure in the foregoing embodiments. The shape of the obtained air bridge structure 501 is more in line with the expected requirements.

In some embodiments, as shown in FIG. 10, the air bridge structure 501 can be a vacuum bridge structure.

In some embodiments, as shown in FIG. 10 to FIG. 14, the air bridge structure 501 may include: a bridge pier part 5012 in contact with the substrate 1, a bridge top part 5011 parallel to the substrate 1, and a bridge approach part 5013 connected between the bridge pier part 5012 and the bridge top part 5011; and the air bridge structure 501 is a separable air bridge structure or a fully-wrapped air bridge structure, where the fully-wrapped air bridge structure is provided with a plurality of open holes 5014 in the bridge pier part 5012 and the bridge approach part 5013.

Figure 12:
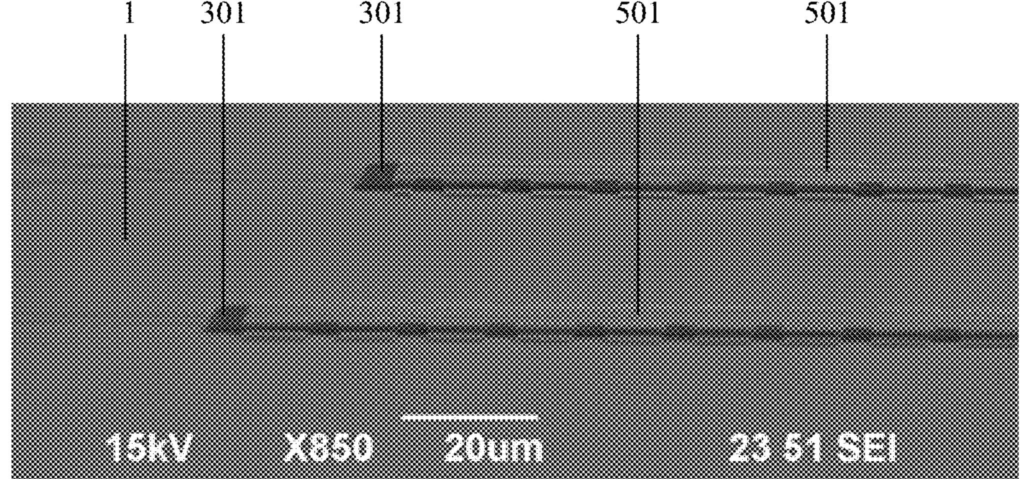
FIG. 12 is a scanning electron micrograph of a fully-wrapped air bridge structure before releasing the bridge supporting structure according to an embodiment of this disclosure.
Figure 13:
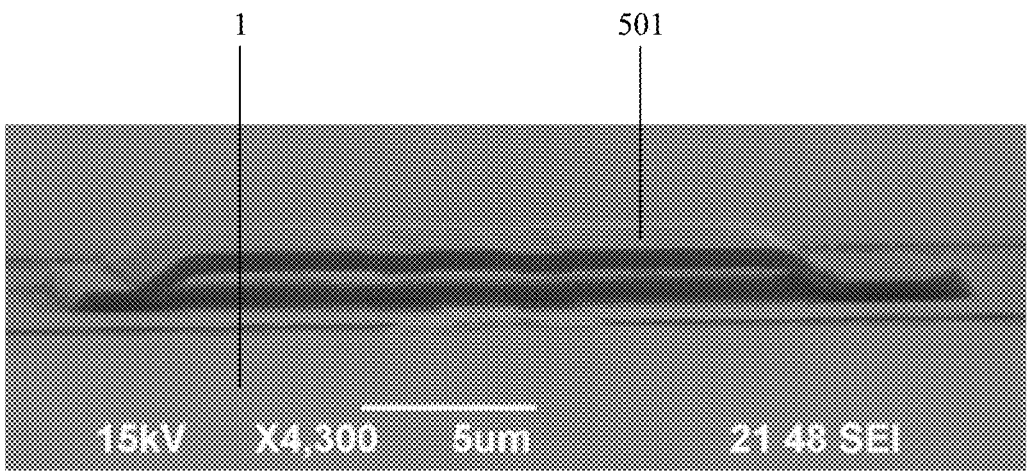
FIG. 13 is a scanning electron micrograph of a separable air bridge structure after releasing the bridge supporting structure according to an embodiment of this disclosure.
Figure 14:
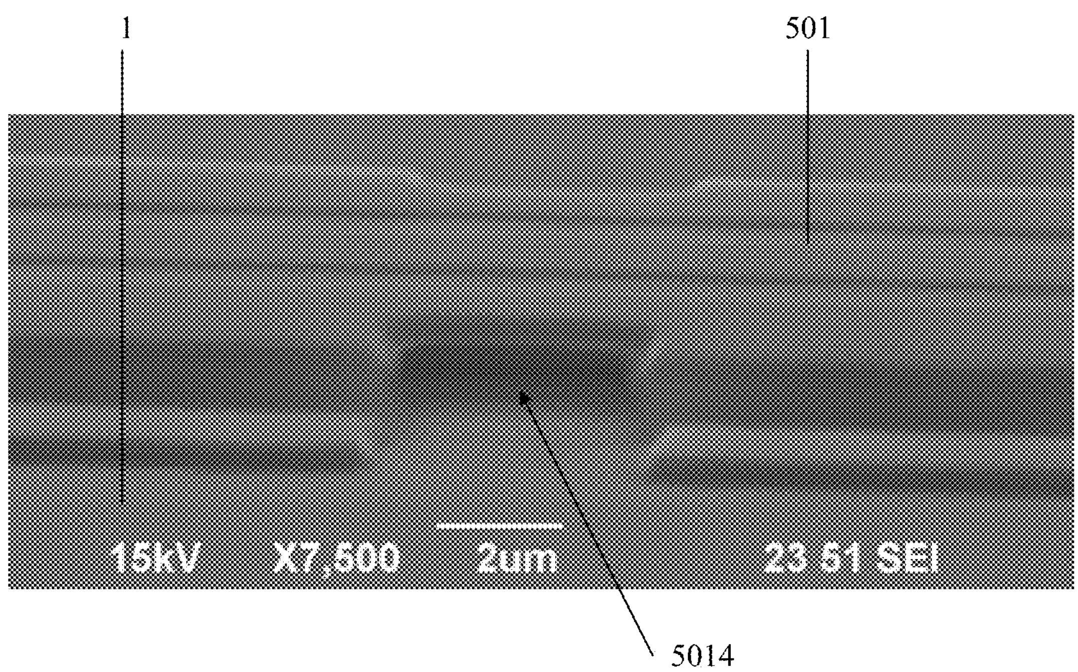
FIG. 14 is a scanning electron micrograph of a fully-wrapped air bridge structure after releasing the bridge supporting structure according to an embodiment of this disclosure.

The air bridge structure 501 and the air bridge structure 501 with the bridge supporting structure 301 that are formed by applying the above manufacturing method for the air bridge structure 501 are observed using an electron microscope, the observed separable air bridge structure 501 with the bridge supporting structure 301 is shown in FIG. 11, and the fully-wrapped air bridge structure 501 with the bridge supporting structure 301 is shown in FIG. 12. After the bridge supporting structure 301 is released, the separable air bridge structure 501 is shown in FIG. 13, and the fully-wrapped air bridge structure 501 is shown in FIG. 14. Because the fully-wrapped air bridge structure 501 is provided with open holes 5014 in the bridge pier part and the bridge approach part, this helps release the bridge supporting structure 301 inside the fully-wrapped air bridge structure 501 completely.

The embodiments of this disclosure provide a superconducting quantum chip, and the superconducting quantum chip includes an air bridge structure in the foregoing embodiments. Based on the beneficial effects of the air bridge structure in the foregoing embodiments, details are not described again herein.

In some embodiments, the superconducting quantum chip further includes a capacitor, a connecting line, a pad, and a packaging structure, etc., which are not described in detail in this embodiment.

In some embodiments, the superconducting quantum chip is a flip chip, which is beneficial for increasing the bit control isolation.

Applying the embodiments of this disclosure can achieve at least the following beneficial effects:

In the air bridge structure and the manufacturing method thereof, and the superconducting quantum chip and the manufacturing method thereof provided by the embodiments, an inorganic material is used to form the bridge supporting structure, and the shape of the bridge supporting structure can be adjusted by adjusting the first photoresist structure, so as to obtain an air bridge structure with an expected shape; and the temperature of the process of forming the bridge supporting structure will not be too high, which can avoid the problem of change of the photoresist property and difficult removal of the photoresist caused by high temperature, and can also avoid the impact of high temperature on the property of a temperature-sensitive device. Meanwhile, the air bridge structure is obtained by stripping the second photoresist structure without etching the air bridge material layer, to avoid a case that the air bridge structure is etched and damaged to cause poor connection between the air bridge structure and the circuit on the substrate, thereby effectively improving the performance of a product with the air bridge structure.

It is understandable to those skilled in the art that the steps, measures, and solutions in the operations, methods, and processes already discussed in this disclosure may be alternated, changed, combined, or deleted. Other steps, measures, and solutions in the operations, methods, and processes already discussed in this disclosure may also be alternated, changed, rearranged, disassembled, combined, or deleted. The steps, measures, and solutions in the operations, methods, and processes in the related art disclosed in this disclosure may also be alternated, changed, rearranged, disassembled, combined, or deleted.

In the description of this disclosure, it is to be understood that orientation or position relationships indicated by the terms such as “center”, “transverse”, “on”, “below”, “left”, “right”, “vertical”, “horizontal”, “top”, “bottom”, “inside”, and “outside” are based on orientation or position relationships shown in the accompanying drawings, and are used only for ease and brevity of illustration and description, rather than indicating or implying that the mentioned apparatus or component needs to have a particular orientation or needs to be constructed and operated in a particular orientation. Therefore, such terms are not to be construed as limiting of this disclosure.

In addition, the terms “first” and “second” are used for descriptive purposes only and are not to be construed as indicating or implying relative importance or implicitly indicating the number of technical features indicated. Therefore, features defining “first” and “second” may explicitly or implicitly include one or more such features. In the description of this disclosure, unless otherwise stated, “a plurality of” means two or more than two.

In the description of this disclosure, unless otherwise explicitly specified or defined, the terms such as “install”, “connect”, and “connection” are to be understood in a broad sense. For example, the connection may be a fixed connection, a detachable connection, or an integral connection; or the connection may be a direct connection, an indirect connection through an intermediary, or internal communication between two components. A person of ordinary skill in the art may understand the specific meanings of the foregoing terms in this disclosure according to specific situations.

In the description of this specification, the specific features, structures, materials, or characteristics described may be combined in any one or more embodiments or examples in an appropriate manner.

It is to be understood that although the steps in the flowchart in the accompanying drawings are sequentially shown according to indication of an arrow, the steps are not necessarily sequentially performed according to a sequence indicated by the arrow. Unless explicitly specified in this specification, execution of the steps is not strictly limited in the sequence, and the steps may be performed in other sequences. In addition, at least some steps in the flowcharts in the accompanying drawings may include a plurality of substeps or a plurality of stages. The substeps or the stages are not necessarily performed at the same moment, but may be performed at different moments. The substeps or the stages are not necessarily performed in sequence, but may be performed in turn or alternately with another step or at least some of substeps or stages of the another step.

The foregoing descriptions are some implementations of this disclosure. A person of ordinary skill in the art may make several improvements and refinements without departing from the principle of this disclosure, and the improvements and refinements shall fall within the protection scope of this disclosure.

What is claimed is:

1. A manufacturing method for an air bridge structure, comprising:

forming a first photoresist structure on a substrate, the first photoresist structure comprising a first photoresist layer on the substrate and a second photoresist layer on the first photoresist layer, the first photoresist structure comprising a first opening that reveals the substrate, the first opening comprising a first sub-opening through the second photoresist layer and a second sub-opening through the first photoresist layer, a first width of the first sub-opening being less than a second width of the first sub-opening such that widths of the first sub-opening decrease with increasing distance from the substrate, and the second width of the first sub-opening through the second photoresist layer being greater than a width of the second sub-opening through the first photoresist layer;

forming a bridge supporting structure on the substrate, (i) both the bridge supporting structure and the first photoresist structure being sacrificial structures, (ii) the bridge supporting structure being arranged in the first opening in the first photoresist structure and having a sloped profile that is formed based on the first width of the first sub-opening being less than the second width of the first sub-opening, (iii) both the bridge supporting structure and the first photoresist layer being directly deposited on the substrate, and (iv) a height of the bridge supporting structure being larger than a height of the first photoresist layer;

stripping the first photoresist structure after the deposition of the bridge supporting structure;

forming a second photoresist structure on the substrate, the second photoresist structure comprising at least a second opening that reveals at least a portion of the bridge supporting structure on the substrate; and forming the air bridge structure by depositing an air bridge material on the substrate based on the second opening and stripping the second photoresist structure after the deposition of the air bridge material.

2. The manufacturing method according to claim 1, wherein the forming the first photoresist structure further comprises:

forming a stack of the first photoresist layer and the second photoresist layer on the substrate;

forming the first sub-opening of the first opening in the second photoresist layer using first photolithography reactions without a participation by the first photoresist layer in the first photolithography reactions, the forming the first sub-opening generating an undercut structure; and forming the second sub-opening of the first opening in the first photoresist layer based on the first sub-opening, the second sub-opening revealing the substrate.

3. The manufacturing method according to claim 2, wherein the forming the stack of the first photoresist layer and the second photoresist layer further comprises:

cleaning and oxidizing the substrate;

coating the substrate with the first photoresist layer;

performing a first baking process;

coating the second photoresist layer on the first photoresist layer; and performing a second baking process.

4. The manufacturing method according to claim 3, wherein the coating the substrate with the first photoresist layer and the performing the first baking process comprises:

coating the first photoresist layer with a thickness of $h_1$, wherein 5 $h_1$SH136 $h_1$, and $H_1$ is a height of the bridge supporting structure; and performing the first baking process at a soft baking temperature of the first photoresist layer.

5. The manufacturing method according to claim 4, wherein:

the coating the second photoresist layer on the first photoresist layer comprises coating the second photoresist layer with a thickness of $h_2$, wherein $h_1+h_2>H_1$; and the performing the second baking process comprises performing the second baking at a soft baking temperature of the second photoresist layer.

6. The manufacturing method according to claim 2, wherein the forming the first sub-opening of the first opening in the second photoresist layer further comprises:

under-exposing the second photoresist layer based on a pattern associated with the bridge supporting structure;

prebaking the second photoresist layer after the under-exposing; and developing and fixing the second photoresist layer, to obtain the first sub-opening that comprises the undercut structure, wherein the first photoresist layer is not subjected to the developing and the fixing of the second photoresist layer.

7. The manufacturing method according to claim 6, wherein:

the under-exposing the second photoresist layer comprises under-exposing the second photoresist layer using an ultraviolet exposure process or a laser direct writing process; and the prebaking the second photoresist layer comprises prebaking the second photoresist layer at a prebaking temperature of the second photoresist layer.

8. The manufacturing method according to claim 2, wherein the forming the second sub-opening of the first opening in the first photoresist layer further comprises:

etching the first photoresist layer by using the second photoresist layer with the first sub-opening as a mask, to form at least the second sub-opening in the first photoresist layer.

9. The manufacturing method according to claim 8, wherein the etching the first photoresist layer comprises:

etching the first photoresist layer based on at least one of a physical etching process and a chemical etching process, to form the second sub-opening through the first photoresist layer.

10. The manufacturing method according to claim 1, wherein the forming the bridge supporting structure on the substrate comprises:

depositing, with an electron beam evaporation method or a thermal evaporation method, at least one of silicon dioxide, nickel-gold alloy, zinc oxide, aluminum oxide, or copper oxide as the bridge supporting structure; and stripping the first photoresist structure in a photoresist stripping liquid at a temperature of 20° C. to 100° C.

11. The manufacturing method according to claim 1, wherein the forming the second photoresist structure comprises:

coating, a third photoresist layer on the bridge supporting structure;

performing a third baking process;

under-exposing the third photoresist layer;

prebaking the third photoresist layer;

developing and fixing the third photoresist layer, to obtain the second opening in the third photoresist layer; and etching, based on the second opening, to remove residual photoresist and an oxidized layer on the substrate.

12. The manufacturing method according to claim 11, wherein:

the coating the third photoresist layer further comprises coating the third photoresist layer with a thickness $h_3$, wherein $H_1+H_2 \leq 3h_3$, $H_1$ is a height of the bridge supporting structure and $H_2$ is a thickness of the air bridge structure; and the performing the third baking process comprises performing the third baking process at a soft baking temperature of the third photoresist layer.

13. The manufacturing method according to claim 11, wherein the etching to remove the residual photoresist and the oxidized layer on the substrate comprises:

etching, using at least one of a physical etching process or a chemical etching process, to remove the residual photoresist and the oxidized layer on the substrate.

14. The manufacturing method according to claim 1, wherein the forming the air bridge structure comprises:

depositing, based on an electron beam deposition process or a molecular beam deposition process, the air bridge material; and stripping, based on a soaking process or an ultrasonic process at a temperature of 20° C. to 100° C., the second photoresist structure.

15. The manufacturing method according to claim 1, further comprising:

removing the bridge supporting structure with a chemical etching method to obtain the air bridge structure.

16. The manufacturing method according to claim 15, wherein the removing the bridge supporting structure further comprises:

using an etching gas that reacts with the bridge supporting structure and lacks reaction with the air bridge material.

17. The manufacturing method according to claim 15, wherein the bridge supporting structure is silicon dioxide, the air bridge material is an electrically conductive material that does not react with hydrogen fluoride, and the removing the bridge supporting structure comprises:

introducing a catalytic gas into an etching machine for removing the bridge supporting structure;

introducing a hydrogen fluoride gas into the etching machine to etch the bridge supporting structure; and introducing a nitrogen gas into the etching machine to remove substances generated during a reaction of the hydrogen fluoride gas with the bridge supporting structure.

18. The manufacturing method according to claim 17, wherein the catalytic gas comprises gaseous water, ethanol, methanol, and isopropanol.

19. The manufacturing method according to claim 17, wherein the hydrogen fluoride gas is anhydrous hydrogen fluoride gas.

* * * * *